United States Patent [19]
Bonyhard et al.

[11] 4,249,249
[45] Feb. 3, 1981

[54] ION-IMPLANTED BUBBLE MEMORY

[75] Inventors: Peter I. Bonyhard; Terence J. Nelson, both of New Providence, N.J.

[73] Assignee: Bell Telephone Laboratories, Incorporated, Murray Hill, N.J.

[21] Appl. No.: 99,552

[22] Filed: Dec. 3, 1979

[51] Int. Cl.³ .............................................. G11C 19/08
[52] U.S. Cl. ...................................... 365/36; 365/15; 365/41
[58] Field of Search ......................................... 365/36

[56] References Cited
U.S. PATENT DOCUMENTS

| 3,792,452 | 2/1974 | Dixon et al. | 365/36 |
| 3,838,407 | 9/1974 | Juliussen | 365/15 |
| 4,142,250 | 2/1979 | Keete et al. | 365/36 |

Primary Examiner—James W. Moffitt
Attorney, Agent, or Firm—Herbert M. Shapiro

[57] ABSTRACT

A magnetic bubble memory of the G-shaped organization is implemented by ion-implantation. Attractive operating margins are realized by the use of transfer-out arrangements which moves bubbles in parallel first to an auxiliary path and thereafter to the major loop in a manner to invert the data.

6 Claims, 8 Drawing Figures

ION-IMPLANTED BUBBLE MEMORY

FIELD OF THE INVENTION

This invention relates to magnetic bubble memories and more particularly to such memories in which paths for bubble movement are defined by a pattern of ion-implanted regions.

BACKGROUND OF THE INVENTION

Ion-implanted magnetic bubble memories are disclosed in U.S. Pat. No. 3,792,452 of M. Dixon, R. A. Moline, J. C. North, L. W. Varnerin, Jr., and R. Wolfe issued Feb. 12, 1974. The patent shows a familiar magnetic bubble memory organization commonly referred to as a major-minor organization. A bubble memory organized in such a manner is characterized by a plurality of closed loop paths termed "minor" loops and at least one major path. A bubble generator and a detector are associated with the major path, and data, represented by a bubble pattern, are moved between ends of the minor loops and the major path typically at transfer ports.

If first and second major paths are used, they are associated with opposite ends of the minor loops with the generator associated with one path and the detector with the other. The transfer function is implemented in this latter case so that transfer-into the loops and transfer-out of the loops occurs as separate functions in the first and second paths respectively. If the first and second paths are connected to form a single major path or loop, a data inversion occurs which, for permalloy bubble memories, is corrected by the familiar G-shaped major-minor organization.

When ion-implantation is employed to define bubble propagation paths, those paths typically are defined at the edge of nonimplanted regions (actually the bubbles reside in the adjacent implanted region) which have interlaced bulges and cusps formed, for example, by contiguous discs. Movement from one path, so formed, to another requires movement across an implanted region. Particularly, for G-shaped major loops a problem arises in that topological constraints preclude separate transfer-out and transfer-in ports from being defined in any obvious ways simply because the bubbles cannot be aligned for transfer into the same loops that they were transferred out from. In a general way this is due to the absence of sufficient numbers of implanted areas for traversal by bubbles where transfer ports are required.

BRIEF DESCRIPTION OF THE INVENTION

The invention is directed at configurations for transfer ports which, for example, permit an ion-implanted G-shaped major-minor organization to be realized simply. In one arrangement the major path is formed by a nonimplanted bubble recirculating "loop" folded into a U-shape, rather than a G-shape geometry. The minor loops extend between the legs of the U-shape. Bubbles are transferred out of the minor loops by a double transfer step which moves bubbles first to one side of the adjacent leg and then to the opposite side of that leg.

In a second embodiment, a single transfer-out step advances a bubble pattern into positions from which it is moved to the opposite side of the leg similar to that of the above-described embodiment in response to a reorienting in-plane field. A section of the major path in this embodiment is formed by nonimplanted islands with implanted gaps therebetween. The gaps are of a geometry and so oriented with respect to a preferred direction of magnetization in the plane of bubble movement to allow a merge function to be performed. A merge function is disclosed in copending application of T. J. Nelson and R. Wolfe Serial No. 99,556 (Case 13–18), filed on Dec. 3, 1979.

DETAILED DESCRIPTION

Figure 1:
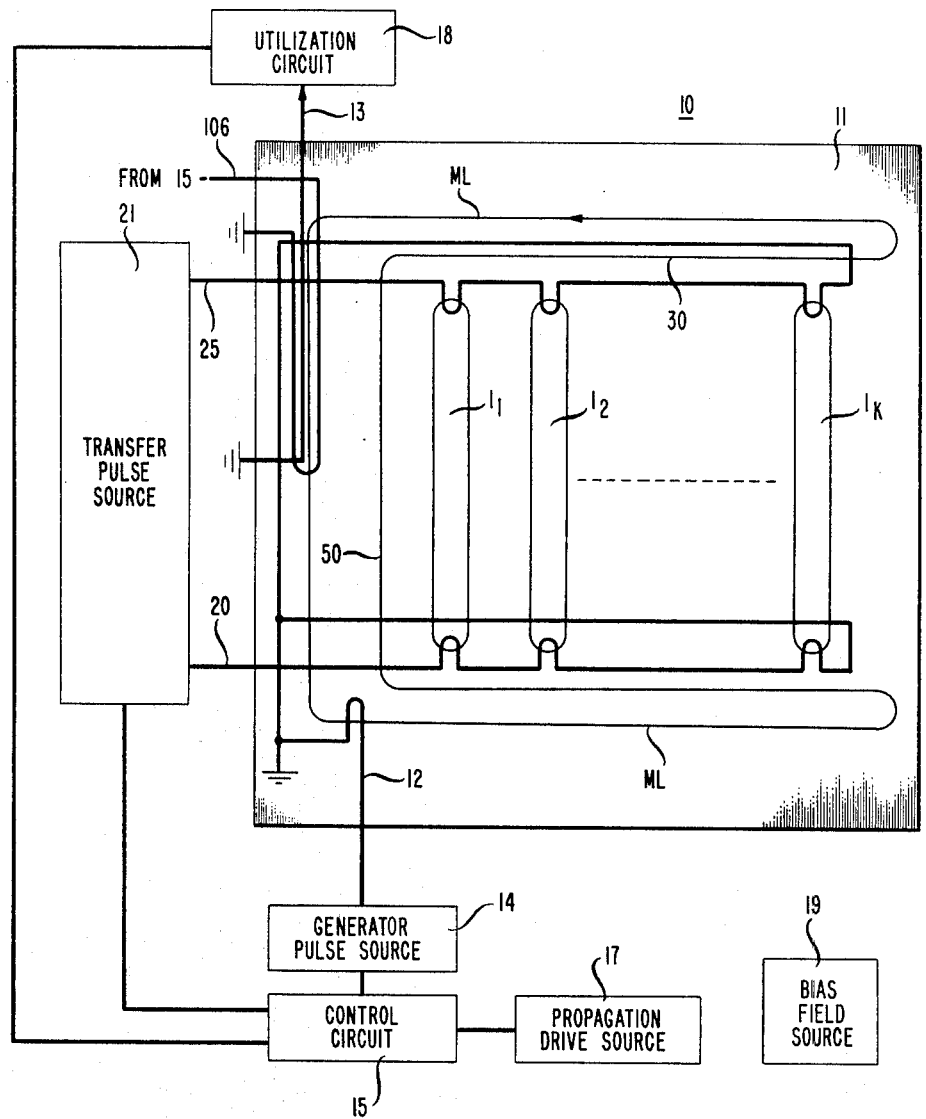
FIG. 1 is a schematic block diagram of a magnetic bubble memory in accordance with this invention.

FIG. 1 shows a magnetic bubble memory 10 including a host layer 11 of a material in which magnetic bubbles can be moved. Bubbles are moved in layer 11 in closed loops, $l_1$, $l_2$ - - - and $l_k$ which are commonly referred to as minor loops and, in addition, in what may be thought of as a single loop ML commonly referred to as a major loop. In the illustrative embodiment, loop ML is folded into the U-shaped configuration mentioned hereinbefore enclosing the minor loops between the top and bottom legs.

Permanent storage of data is provided by the minor loops. The major loop, on the other hand, provides for access to the minor loops of substitute data from a bubble generator 12 and for read out of addressed data at a detector 13. In this connection generator 12 comprises an electrical conductor connected between a generator pulse source 14 and ground operative under the control of control circuit 15 to provide a pulse selectively during each cycle of a propagation drive circuit represented by block 17. Detector 13 similarly is shown connected between a utilization circuit 18 and ground and may include a magnetoresistance detector element. Bubbles are maintained at a nominal diameter by a bias field supplied by source 19.

We will adopt the convention that data, generated at 12, move counterclockwise about loop ML to locations at the lower ends of minor loops $l_1$ in response to successive propagation cycles (of the in-plane field). A transfer-in conductor 20 couples those ends of the minor loops with associated stages of the major loop for transferring new data into the minor loops at the proper time. Conductor 20, to this end, is connected between a transfer pulse source 21 and ground as shown.

A similar transfer operation, termed a transfer-out operation occurs at the top ends of the minor loops as viewed. The transfer-out operation is controlled by a pulse in conductor 25 which is similarly connected between pulse source 21 and ground. The control of the transfer function as well as the generator, propagation and detector operation is derived from a master clock in accordance with well understood principles. Such circuitry along with an address register is considered to be included within control circuit 15.

The general organization of the memory of FIG. 1 thus can be seen to involve the generation of a bubble pattern at 12 for later storage in the minor loops by the activation of transfer conductor 20 during a write operation. Also involved is the transfer-out of addressed data from the minor loops by the activation of transfer-out conductor 25. The data transferred out advances to detector 13 for applying signals representative of the transferred bubble pattern to utilization circuit 18. The data moves counterclockwise along loop ML until a later transfer-in operation moves the data back into vacancies at the bottom of the minor loops as viewed.

In this connection, it is helpful to recognize that bubbles usually move synchronously in all the loops of the memory. When a transfer-out operation occurs, vacancies are left in the addressed bit locations in the minor loops. Those vacancies move about the minor loops as the transferred data move to detector 13. The number of stages in the minor loops and the number in the major loop are chosen so that data transferred out or data generated at 12 arrive at the lower end of the minor loops synchronously with those vacancies.

The general operation of G-shaped major-minor bubble memories is well understood in the art and is not discussed further herein. But the implementation of such a memory by ion-implantation is fostered by transfer ports for movement of data in and out of the minor loops. It is to these transfer ports that we now direct out attention. It will become clear that the U-shaped organization of the major path cooperates with the geometry and operation of the transfers and the transfer ports accordingly will be discussed in connection with a discussion of the detail of the major path.

Figure 2:
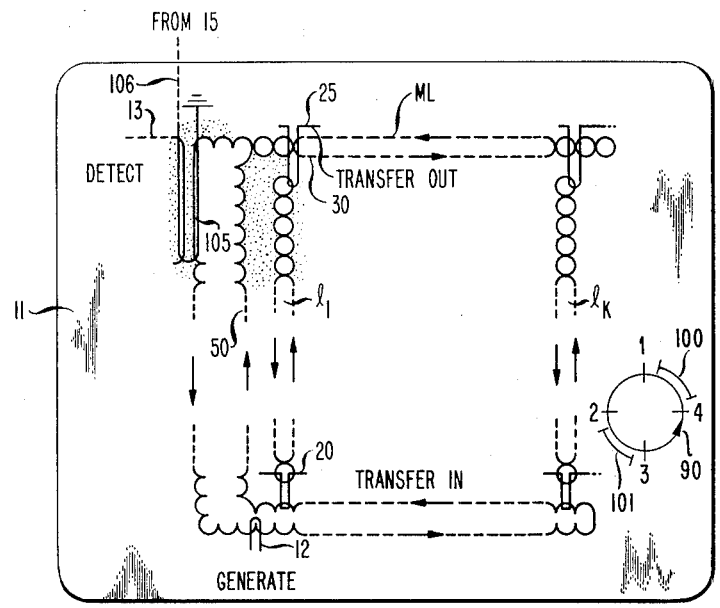
FIGS. 2, 3, and 4, are enlarged top views of various portions of the memory of FIG. 1.

FIG. 2 shows a top view of the ion-implant pattern of the memory of FIG. 1 indicating the essential features of the memory organization. The minor loops $l_1$, to $l_k$ are shown as contiguous discs. The discs are nonimplanted regions in an otherwise implanted surface region of layer 11. The implanted portion of the layer is shown stippled about the minor loop $l_1$. It is helpful to recognize that a single side of a set of discs comprises interleaved bulges and cusps where the cusps are pointed into an nonimplanted region. Note that conductors 12 and 13 couple layer 11 at the major loop defining generate and detect regions as indicated in FIG. 2. Further, electrical conductors 20 and 25 define transfer ports for the "transfer-in" and "transfer-out" regions respectively, as also indicated in FIG. 2.

In operation, bubbles move in a counterclockwise direction about both loop ML and the minor loops as indicated by the arrows in FIG. 2. We will assume that source 21 of FIG. 1 pulses conductor 25 at an appropriate time for transferring bubbles. The bubble transfer-out operation is described in connection with FIG. 3.

Figure 3:
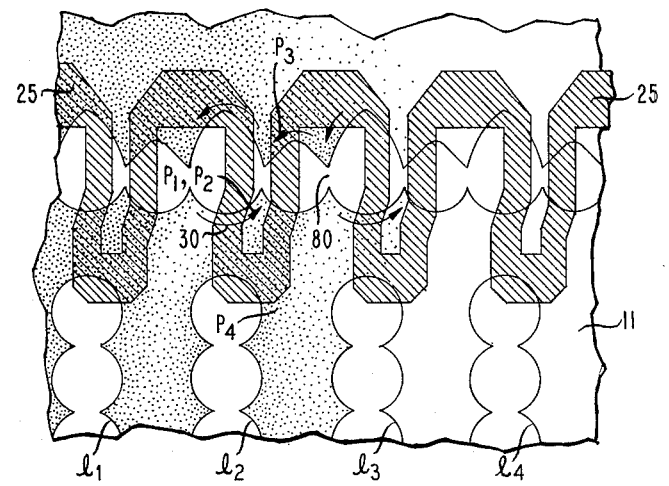

FIG. 3 shows enlarged a portion of layer 11 in which ion-implanted regions define the minor loops and major loop including auxiliary path 30. The ion-implanted portions are shown stippled. Essentially disc-shaped structures are formed and bubbles move counterclockwise about the periphery of those structures in the illustrative embodiment.

FIG. 3 shows not only the top discs of minor loops $l_1$–$l_4$, but also shows a set of discs 80. Disc set 80 includes disc-shaped bulges on the bottom as viewed and a "roof-top" pattern of alternating raised and lowered pointed features on the top. Auxiliary path 30 of FIG. 1 is defined along the bottom periphery of disc set 80 and major loop ML is defined along the top periphery of disc set 80. Bubble movement proceeds from left to right and from right to left respectively in response to an in-plane field reorienting counterclockwise in the plane of layer 11 as indicated by curved arrow 90 in FIG. 2. The field is discussed in terms of successive orientations 90 degrees apart as indicated by reference points 1, 2, 3, and 4 on curved arrow 90. The bubble assumes positions $P_1$, $P_2$, $P_3$, and $P_4$ corresponding to the reference points. A bubble being transferred out of a minor loop experiences a double transfer operation first to path 30 and then (in parallel) to loop ML during a single cycle of the in-plane field due, illustratively, to a double pulse applied to conductor 25 by source 21 during the transfer cycle.

The movement of the bubble during the transfer cycle is represented by the sequence of notations $P_1$–$P_4$ occupied by the bubble during the cycle. In the normal sequence of operating a bubble memory, bubbles are moved to minor loop positions $P_4$ shown at loop $l_2$ in FIG. 3. At this junction in the cycle source 21 applies a pulse to conductor 25 of a duration equal to a quarter cycle of the in-plane field as indicated by the bracket 100 in FIG. 2. A bubble present at $p_4$ in the minor loop when such a pulse is applied, moves to position $p_1$ at the associated cusp in path 30. The in-plane field next rotates to the 2 orientation leaving the bubble only negligibly affected in the cusp. The field next reorients to a 3 orientation accompanied by a second pulse in conductor 25 as represented by the bracket 101 in FIG. 2. In response, the bubble moves to the opposite cusp in path ML. Thus in a single cycle of operation a bubble from loop $l_2$ is moved to position $p_3$ in major loop ML and is moving counterclockwise in that loop as is consistent with the arrows in the figures.

Of course, each one of the minor loops has a bubble (or no bubble) in a corresponding position when conductor 25 is pulsed. Thus, in response to the transfer pulses on conductor 25, a pattern of bubbles moves first into auxiliary path 30 and thereafter into loop ML during a single transfer cycle. In response to subsequent cycles of the in-plane field, the pattern moves counterclockwise in major loop ML to the area of the detector coupled by conductor 13.

The detector area is defined, illustratively, by an elongated bulge 105 in FIG. 2 in the sequence of bulges and cusps defining loop ML. The elongated bulge is along the axis of bubble propagation and operates to control the bubble, in line, as it expands along the elongated bulge. At that point in the operation, control circuit 15 of FIG. 1 pulses conductor 106 (FIGS. 1 and 2) to stretch the bubble for activating a magnetoresistance element formed (by permalloy) as a part of conductor 13.

Figure 4:
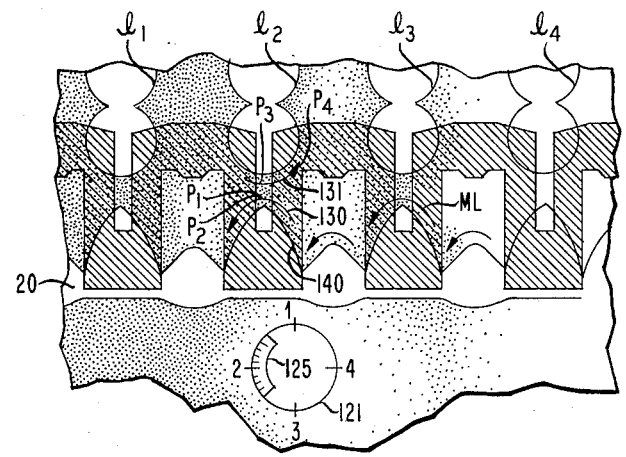

The flow of data represented by a bubble pattern from an address in memory (in the minor loops) selected by the transfer operation and detected by utilization circuit 18 via the magnetoresistance element, moves along loop ML after detection. Meanwhile, vacancies left in minor loops, due to the transfer, move counterclockwise synchronously. The data move in loop ML to the transfer-in region of FIG. 2 as do the originating vacancies move in the minor loops to that region. FIG. 4 shows a top view of a transfer-in implementation for moving a bubble pattern in the major loop back into those originating vacancies.

Figure 5:
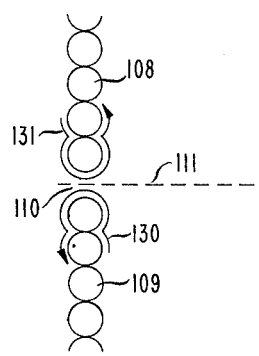
FIGS. 5, 6, and 8 are enlarged top views of alternative portions of a memory of the type shown in FIG. 1.
Figure 6:
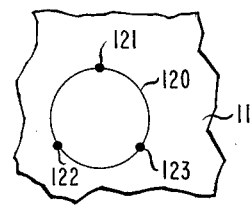

The transfer-in implementation, as well as the double transfer-out implementation, is unique in and of itself. The organization of the ion-implanted regions in FIG. 4 is designed to take advantage of a "worst case" orientation, of the gap between the end of the minor loop and the major loop with respect to the crystallographic orientation of host layer 11. The term "worst case" is used for comparison with a "best case" orientation for achieving a merge operation as disclosed in copending application Ser. No. 99,556, filed Dec. 3, 1979 for T. J. Nelson-R. Wolfe (Case 13–18). The term applies to two sequences of periodic (non) implanted patterns separated by a gap. FIG. 5 shows such an arrangement as first and second sets of contiguous discs 108 and 109 separated by a gap 110 with an axis 111. The orientation relates to the orientation of the axis of the gap with respect to the orientations of preferred bubble positions which correspond to the axis of symmetry of the cubic garnet crystal of host layer 11. FIG. 6 shows a disc 120 with preferred positions 121, 122, and 123 shown thereabout. These positions are 120 degrees apart. The above-mentioned application of Nelson discloses a merge port where axis 110 aligns with position 121. The present transfer-in port is operative when axis 110 is radially displaced 90 degrees from position 121. Such an orientation ensures maximum independence between bubbles moving in paths 130 and 131 of FIG. 5 even when gap 109 is reduced to two bubble diameters or less rather than the more typical spacing of four bubble diameters between a minor loop and the associated stage of the major loop.

With this choice of orientations in mind we return to FIG. 4 where path 130 of FIG. 5 may be taken to comprise the bubble path of major loop ML and path 131 of FIG. 5 may be taken to comprise the path of minor loop $l_2$. Notice from FIGS. 1 and 2 that data in the position of the major loop closer to the lower ends of the minor loops, as viewed in the figures, moves from right to left as shown in FIG. 4.

During a transfer-in cycle, a bubble arrives at position $p_1$ at the peak of a bulge 140 associated with minor loop $l_2$. As the in-plane field reorients as indicated by the curved arrow 121 in FIG. 4, a transfer-in pulse is applied to conductor 20, of FIG. 1 by source 21. This pulse is of a duration to last until the in-plane field almost reorients to 3 as shown by bracket 125 in FIG. 4. At the termination of the transfer-in pulse, the bubble is in position $p_3$ at the bottom of minor loop $l_2$. The bubble moves along path 131 to position $p_4$ as the in-plane field rotates further counterclockwise to a 4 orientation. Of course, the entire bubble pattern in the major loop is transferred-in to the vacancies positioned in positions $p_3$ in all the minor loops in a manner similar to the transfer operation described in connection with FIG. 4 and snychronously with that operation. Consequently, data transferred out and detected is now transferred back into minor loops completing a read operation.

Figure 7:
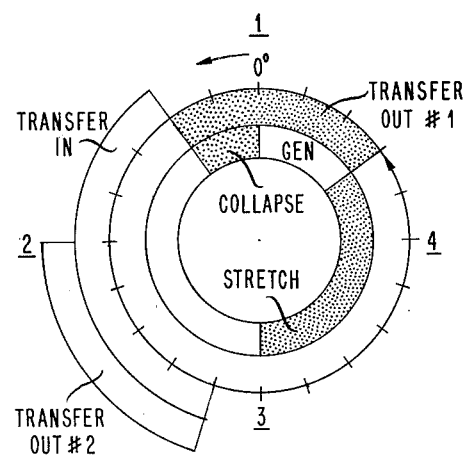
FIG. 7 is a diagram of the operation of the memory of FIG. 1.

FIG. 7 is a pulse timing diagram summarizing the operation of the memory of FIGS. 1–4 with respect to the in-plane field. Note that the stretch-collapse or "interrogate" pulse herein occurs during the 3 and 4 phases of the in-plane field and has a duration of one and one quarter cycle. The interrogate pulse also may occur during the 1 phase of the in-plane field and may be of shorter duration as shown.

The designation of the interrogate pulse as a stretch-collapse pulse in FIG. 7 indicates destructive read. This need not be the case. Nondestructive read arrangements useful herein are well known in the art. The read operation as described herein assumes the presence of such a nondestruct read arrangement.

But a write operation herein requires the annihilation of data which has been read out in order to clear vacancies in the minor loops for new data. Destructive detection of data is achieved herein by the provision of a collapse pulse on conductor 106 of FIG. 2 by control circuit 15. Nondestructive read is provided herein by a lower level pulse on conductor 106 to merely shrink an elongated bubble again to the normal operating diameter determined by bias field source 19 of FIG. 1.

The write operation commences with control circuit 15 determining the read out of data from a selected address by a transfer-out pulse followed (timely) by a destructive read. Generator pulse source 14 applies a pulse sequence to conductor 12 in successive cycles of the in-plane field as indicated at "GEN" in FIG. 7. The bubble pattern so generated moves to the transfer in region of FIG. 4 to be returned to vacancies, left unused by the annihilated data, as described hereinbefore. The operation of the memory is now complete.

It is to be noted that both FIGS. 3 and 4 show uneven bulges, alternate ones of the bulges extending beyond the interleaved bulges. This unevenness is to augment poles during strategic phases of the in-plane field cycle and to remove those poles from neighboring cusps. Operating margins are extended in this manner.

Further, the implanted and nonimplanted regions shown in FIGS. 2, 3, and 4 occupy a patterned plane in layer 11 of FIG. 1. A uniform ion-implanted layer is also included in layer 11 as disclosed in copending application Ser. No. 89,090 filed Oct. 29, 1979 for T. J. Nelson (Case 14). The presence of such a layer allows for a preferred generator design as is disclosed also in that application and facilitates double transfer or the passage of bubbles through an otherwise nonimplanted region.

The transfer of a bubble pattern to a first path (30) at the transfer-out end of the minor loops and, thereafter, to a second parallel path (the corresponding section of major loop ML) results in a reversal of the data stream. Thus, the double transfer-out operation actually constitutes an inverting operation. The inversion of data may be understood by a glance at FIG. 1 comparing data transferred into ML by the double transfer with data transferred into path 30 and moved counterclockwise to like positions in loop ML.

Figure 8:
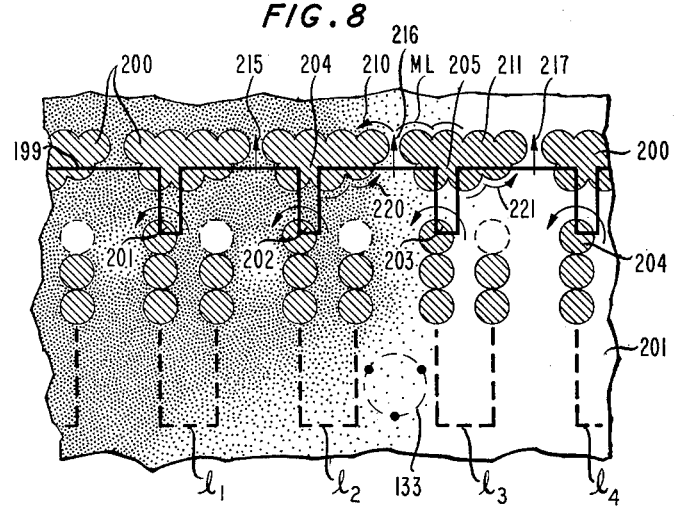

FIG. 8 shows an alternative transfer arrangement which also accomplishes such an inversion. The figure shows a plurality of minor loops $l_1$, $l_2$—and a transfer conductor 199. The transfer conductor couples the end disc of a set of contiguous discs which define each minor loop. The major loop ML is defined by a plurality of multistage islands 200 of nonimplanted regions in the layer 201 of bubble propagation. The overall organization of a memory of the type shown in FIG. 8 is essentially the same as that shown in FIG. 1, data moving counterclockwise also as shown in that figure. In this context, however, there is no continuous U-shaped major loop, as one section (30) is nonpropagating because of the merge ports.

A transfer pulse on conductor 200 transfers bubbles at positions 202 and 203 to positions 204 and 205 as the reorienting in-plane field reorients from the 1 position to the 3 position as explained in connection with curved arrow 90 of FIG. 2. In response to three subsequent cycles of the in-plane field, bubbles, so transferred, move to positions 210 and 211.

The islands are separated by gaps 215, 216, 217—, the axis of which aligns antiparallel to the preferred bubble positions corresponding to one of the threefold axis of symmetry characteristic of the cubic materials used for layer 201 as described in corresponding application Ser. No. 99,556 filed Dec. 3, 1979 for T. J. Nelson and R. Wolfe (Case 13–18). That is to say, the axes of the gaps in FIG. 8 align with a layer 201 oriented as indicated by circle 133 in that figure. The gap between the islands also is about equal to a bubble diameter. Gaps so aligned and of such spacings cause a merge so that bubbles moving, for example, along either the minor loops at positions 202 and 203 or along path ML move counterclockwise along path ML thus achieving the operation essentially as described in connection with FIG. 1.

The fact that data inversion in this embodiment occurs can be confirmed by a glance at FIGS. 1 and 8. Each of paths 220 and 221 of FIG. 8 is analogous to auxiliary path 30 of FIG. 1 operating to move bubbles to the right as viewed. Thus, the bubble from minor loop $l_2$ follows the bubble from loop $l_3$. After transfer into major path ML in either of the figures the bubble from loop $l_2$ precedes the bubble from loop $l_3$ as data moves to the left as viewed. Thus, it is clear that data inversion occurs.

Bubble memories of the type described herein have been built and tested. The layer of bubble movement is defined in an epitaxially grown film of $Y_{1.0} Sm_{0.5} Lu_{0.7} Ca_{0.8} Ge_{0.8} Fe_{4.2} O_{12}$ on a nonmagnetic substrate of $Gd_3 Ga_5 O_{12}$. The film had a thickness of 1.88 microns and a saturation induction of 500 gauss. The nominal bubble size was 1.76 microns and the period of the ion-implanted pattern was eight microns. Operation at a 50 kiloherz rate with transfer-out pulses of 60 mA amplitude and transfer-in pulses of 120 mA amplitude provided operating margins of 15 oersteds. Margins for the propagation operation were 18 oersteds overlap between minor loops and major loops.

It has been found in operation with test circuits that the transfer-out section as shown in FIG. 3 can be made to operate to first transfer and then replicate data into loop ML. The operation is essentially as described in connection with the double transfer. In addition, in this case an extra bubble pattern moves to the right along path 30 for later confirmation of the replicated pattern or for annihilation or both.

What has been described is considered merely illustrative of the principles of this invention. Therefore, various modifications of this invention can be devised by those skilled in the art in accordance with those principles withn the spirit and scope of the invention as covered by the following claims.

We claim:

1. A magnetic bubble memory comprising a layer of material in which magnetic bubbles can be moved, a pattern of ion-implanted regions in said layer for defining a plurality of minor loops for recirculating bubbles therein through transfer positions in response to a field reorienting cyclically in the plane of said layer, said pattern also defining first and second multistage paths associated with said first ends, and transfer means for moving a bubble pattern selectively from said transfer positions to associated positions in said second path through associated positions in said first path.

2. A magnetic bubble memory in accordance with claim 1 wherein said first and second paths respond to said reorienting field to move bubbles in first and second direction respectively and interconnect to form a multistage major loop.

3. A magnetic bubble memory in accordance with claim 2 wherein each of said first and second paths includes a stage thereof associated with each of said minor loops.

4. A magnetic bubble memory in accordance with claim 3 wherein said major loop has a U-shaped geometry with first and second legs where said legs include stages associated with said minor loops at said first and second ends respectively.

5. A magnetic bubble memory in accordance with claim 3 wherein said transfer means includes means responsive to first and second pulses applied during a cycle of said reorienting field for transferring bubbles from said transfer positions to associated stages in said first and second path consecutively.

6. A magnetic memory in accordance with claim 1 wherein said major path is defined by a sequence of nonimplanted multistage islands separated by ion-implanted gaps, each of said islands being associated with a different one of said minor loops at said first ends.

* * * * *